US008163590B2

(12) United States Patent  
Yun

(10) Patent No.: US 8,163,590 B2  
(45) Date of Patent: Apr. 24, 2012

(54) IMAGE SENSOR AND METHOD FOR MANUFACTURING THE SAME

(75) Inventor: Young Je Yun, Yongin-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 414 days.

(21) Appl. No.: 12/510,532

(22) Filed: Jul. 28, 2009

(65) Prior Publication Data

US 2010/0032782 A1 Feb. 11, 2010

(30) Foreign Application Priority Data

Aug. 6, 2008 (KR) .................. 10-2008-0076944

(51) Int. Cl.  
*H01L 21/00* (2006.01)

(52) U.S. Cl. .................. 438/71; 438/70; 257/E31.127

(58) Field of Classification Search .................. 438/27, 438/29, 42, 65, 69, 70, 71, 781; 257/431, 257/432, E31.127  
See application file for complete search history.

(56) References Cited

U.S. PATENT DOCUMENTS

| 7,348,202 | B2 * | 3/2008 | Lee | 438/57 |
| 7,863,073 | B2 * | 1/2011 | Park | 438/57 |
| 2006/0079017 | A1 * | 4/2006 | Taguchi | 438/60 |
| 2007/0152286 | A1 * | 7/2007 | Ahn | 257/414 |
| 2008/0080068 | A1 * | 4/2008 | Maeno | 359/811 |
| 2008/0116537 | A1 * | 5/2008 | Adkisson et al. | 257/448 |
| 2008/0117319 | A1 * | 5/2008 | Jiang et al. | 348/273 |
| 2008/0157243 | A1 * | 7/2008 | Cho | 257/432 |
| 2008/0283887 | A1 * | 11/2008 | Lee | 257/292 |
| 2008/0293181 | A1 * | 11/2008 | Ryu et al. | 438/70 |
| 2008/0315341 | A1 * | 12/2008 | Lee | 257/432 |

FOREIGN PATENT DOCUMENTS

| JP | 06104480 A | * | 4/1994 |
| KR | 10-2007-0030448 A | | 3/2007 |
| KR | 10-2007-0050294 A | | 5/2007 |
| KR | 2011031582 A | * | 3/2011 |

* cited by examiner

*Primary Examiner* — Matthew Landau  
*Assistant Examiner* — Joseph C Nicely  
(74) *Attorney, Agent, or Firm* — Saliwanchik, Lloyd & Eisenschenk

(57) ABSTRACT

Disclosed are an image sensor and a method of manufacturing the same. The image sensor includes a substrate including a pixel area and a logic circuit area; an interlayer dielectric layer on the substrate and having a trench in the pixel area; and an insulating layer microlens formed in the trench of the interlayer dielectric layer. According to the method, a substrate including a pixel area and a logic circuit area is prepared; an interlayer dielectric layer is formed on the substrate; a first microlens pattern is formed on the interlayer dielectric layer on the pixel area; and a second microlens pattern is formed by etching the interlayer dielectric layer on the pixel area using the first microlens pattern as an etch mask. During the etching, a second photoresist pattern, exposing the first microlens pattern, can be used to protect the interlayer dielectric layer on the logic circuit area.

7 Claims, 3 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0076944, filed on Aug. 6, 2008, which is hereby incorporated by reference in its entirety.

BACKGROUND

Issues exist in the manufacturing process for an image sensor. For instance, the thickness of a BEOL (back end of line) layer has increased due to a complicated logic circuit for realizing small-sized pixels having high resolution. In addition, as the pixels have been scaled down, there is a limitation in reducing the vertical distance between a microlens and a photodiode.

The minimum size of a light spot focused on a photodiode is limited to the size of the Airy disc, and the size of the Airy disc is inversely proportional to the diameter D of the microlens. However, the size of the Airy disc increases as the pixel size is reduced, so the minimum size of the light spot focused on the photodiode approximately reaches the pixel size.

The size of the Airy disc defined by f(1/D) is proportional to the focal length f of the microlens. Thus, the simplest method for solving the above problems is to shorten the focal length f by reducing the vertical distance between the microlens and the photodiode. However, this method may not be easily achieved because the thickness of the BEOL layer of the logic circuit is gradually being increased. Thus, the image sensor having the conventional structure cannot simultaneously solve the above two problems.

In order to solve the above problems, an array etch back scheme has been proposed. According to this scheme, the BEOL layer formed on a pixel area is exclusively subject to the array etch back process. However, when this process scheme is actually applied, non-uniformity of center-to-edge lens height and gap CD may occur due to a pixel edge where high step difference occurs during a lithography process for forming the microlens.

In addition, photoresist residue, which is generated when microlens photoresist is coated, may randomly remain at sidewalls.

Further, 'best focus' of the lithography process is set to the pixel area where a lens is formed, so photo keys (e.g., overlay boxes), which are formed on an area above the pixel area by about 1 μm, may be severely defocused so that the photo keys are abnormally formed. Thus, normal in-line measurement through the photo keys may be difficult.

BRIEF SUMMARY

An image sensor according to an embodiment includes a substrate including a pixel area and a logic circuit area, an interlayer dielectric layer formed on the substrate and formed with a trench in the pixel area of the substrate, and an insulating layer microlens formed in the trench of the interlayer dielectric layer on the pixel area.

A method of manufacturing an image sensor according to another embodiment includes preparing a substrate including a pixel area and a logic circuit area, forming an interlayer dielectric layer on the substrate, forming a first microlens pattern on the interlayer dielectric layer on the pixel area, and forming a second microlens pattern by etching the interlayer dielectric layer on the pixel area using the first microlens pattern as an etch mask.

DETAILED DESCRIPTION

Hereinafter, embodiments of an image sensor and a manufacturing method thereof will be described with reference to the accompanying drawings.

In the description, it will be understood that when a layer is referred to being "on" or "under" another layer, it can be "directly" or "indirectly" on the other layer or one or more intervening layers may be also be present.

The embodiments of the present invention are not limited to a CMOS image sensor (CIS). That is, embodiments can be applied to various image sensors, such as CCD image sensors, if the image sensors require a microlens.

Figure 1:
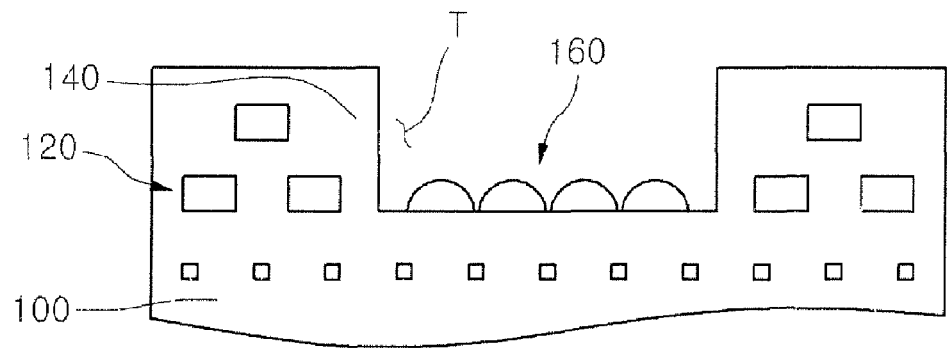
FIG. 1 is a cross-sectional view showing an image sensor according to an embodiment.

FIG. 1 is a cross-sectional view showing an image sensor according to an embodiment.

The image sensor according to an embodiment includes a substrate 100 having a pixel area and a logic circuit area, an interlayer dielectric layer 140 on the substrate 100 and formed with a trench T on the pixel area of the substrate 100, and an insulating layer microlens 160 formed in the trench T on the pixel area.

According to the image sensor of an embodiment, an array etch process is performed using double exposure, so that a microlens process margin can be significantly improved as compared with a case in which a microlens process is performed after an array etch back is performed.

Further, according to the image sensor of an embodiment, instead of using organic material such as photoresist, an insulating layer (inorganic material), for example, an oxide layer may form the microlens, so resistance against particles can be reinforced during a sawing process. Non-described reference numerals of FIG. 1 will be explained through the following manufacturing method.

Figure 2:
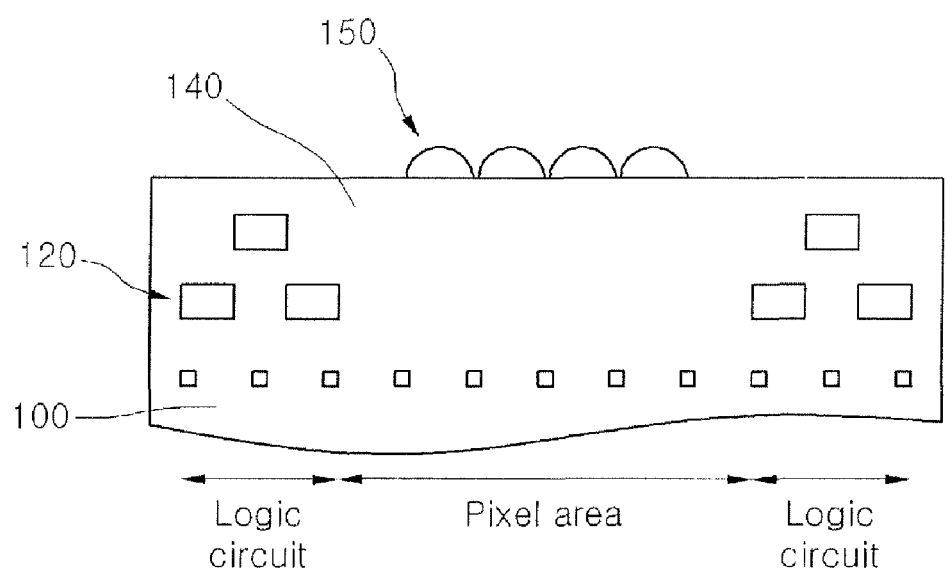
FIGS. 2 to 5 are cross-sectional views showing the procedure for manufacturing an image sensor according to an embodiment.

Hereinafter, a manufacturing method of an image sensor according to an embodiment will be described with reference to FIGS. 2 to 5. First, as shown in FIG. 2, a substrate 100 including the pixel area and the logic circuit area is prepared. The substrate 100 includes image detectors (not shown) formed in each pixel. The image detector may include a photodiode. However, embodiments are not limited thereto. That is, the image detector may include a photogate, a combination of photodiode and photogate, and the like.

Meanwhile, according to certain embodiments, in the case of an image sensor having a specific structure in which an insulating layer, for example, an oxide layer, is formed on the uppermost portion of a BEOL layer instead of a color filter array, a thin pixel area and a thick logic circuit can be simultaneously formed and a microlens lithography process can be performed with respect to a flat plane.

That is, according to an embodiment, the image detector can be applied to a case in which no color filter is required, such as when RGB photodiodes are stacked in the substrate.

Further, in the case of a black and white image sensor, no color filter is required and the photodiode may be a normal photodiode other than the stack-type photodiode.

Next, the interlayer dielectric layer 140 is formed on the substrate 100. For example, the interlayer dielectric layer 140 can be formed using an insulating layer such as an oxide layer having properties of light transmission.

Then, a first microlens pattern 150 is formed on the interlayer dielectric layer 140 on the pixel area. For example, the first microlens pattern 150 can be formed using photoresist. Further, after the photoresist pattern is formed, a thermal reflow process is performed. The reflowed first microlens pattern 150 is rarely damaged by alkali solution such as developer because the reflowed first microlens pattern 150 has great resistance against the alkali solution.

Figure 3:
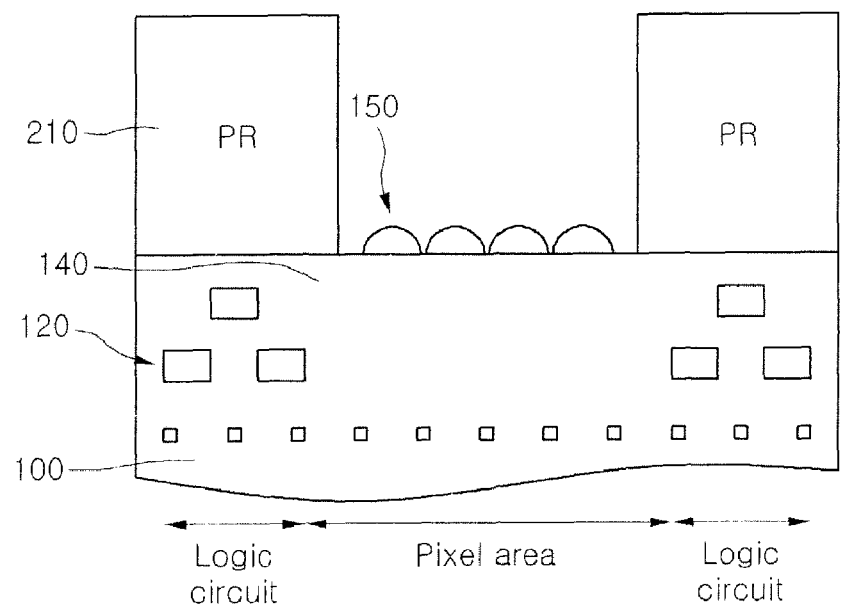

As shown in FIG. 3, a photoresist pattern 210, which exposes the first microlens pattern 150, is formed on the interlayer dielectric layer 140. Even if a development process is performed to form the photoresist pattern 210, the reflowed first microlens pattern 150 is rarely damaged by the alkali solution because the reflowed first microlens pattern 150 has the resistance against the alkali solution.

According to an embodiment, the photoresist pattern 210 may serve as an etch mask to inhibit the logic circuit area from being etched during the subsequent array etch process. In a specific embodiment, the photoresist pattern 210 may have a thickness of about 2 μm to about 3 μm.

Figure 4:
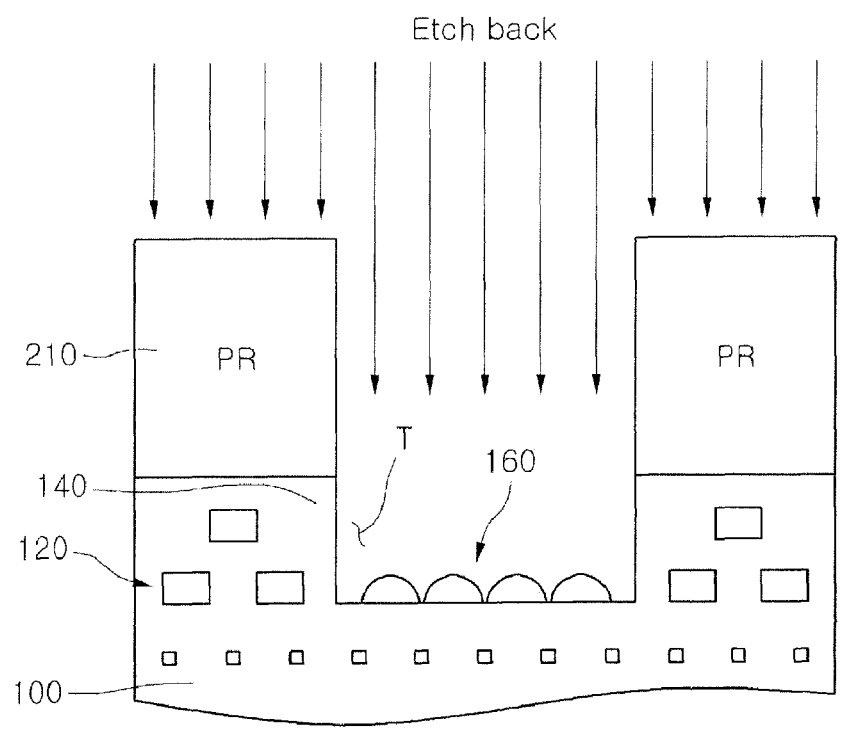

As shown in FIG. 4, the interlayer dielectric layer 140 on the pixel area is etched using the first microlens pattern 150 as an etch mask to form a second microlens pattern 160. At this time, the photoresist pattern 210 may also serve as the etch mask. As described above, the interlayer dielectric layer 140 on the pixel area is etched, so a trench is formed in the interlayer dielectric layer 140 on the pixel area.

In detail, the etch back process is performed such that etching selectivity of the oxide layer (interlayer dielectric layer) and the first microlens pattern 150 (and photoresist pattern 210) is about 1:1, so the first microlens pattern 150 on the pixel area is transferred to a lower portion of the interlayer dielectric layer 140, and the logic circuit area is not etched because the photoresist pattern 210 (which is much thicker than the first microlens pattern 150) serves as an etch mask. The pixel area can be etched by about 1 μm to about 2 μm which is slightly less than the thickness of the photoresist pattern 210 because the etching selectivity of the interlayer dielectric layer and the photoresist pattern 210 is about 1:1. Therefore, the photoresist pattern 210 has a thickness greater than the depth of the trench to be formed in order to protect the interlayer dielectric layer 140 on the logic circuit area.

Figure 5:
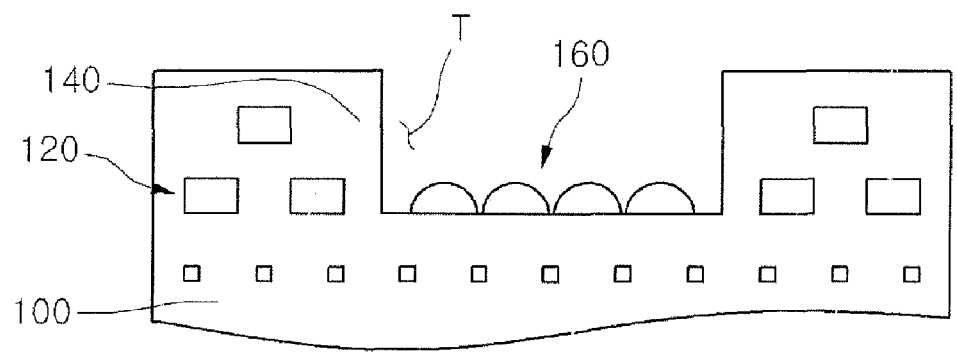

As shown in FIG. 5, the remaining photoresist pattern 210 is removed.

That is, once the array etch process is completed for the first microlens pattern 150 transferred through the etch back process, an ashing process is performed using O2 plasma and the like and then a cleaning process is performed using wet etch chemical, so the manufacturing procedure is completed.

Then, an annealing process may be performed to attenuate deterioration which may occur during the etching process.

According to the image sensor and the method for manufacturing the same of the embodiment, the array etch process is performed using the double exposure, so that the microlens process margin at a peripheral portion of the pixel area can be significantly improved as compared with a case in which the microlens process is performed after the array etch back process is performed.

Further, according to the embodiment, instead of using organic material such as photoresist for the microlens, an insulating layer (inorganic material) is used to form the microlens, so resistance against particles can be reinforced during the sawing process.

Figure 6:
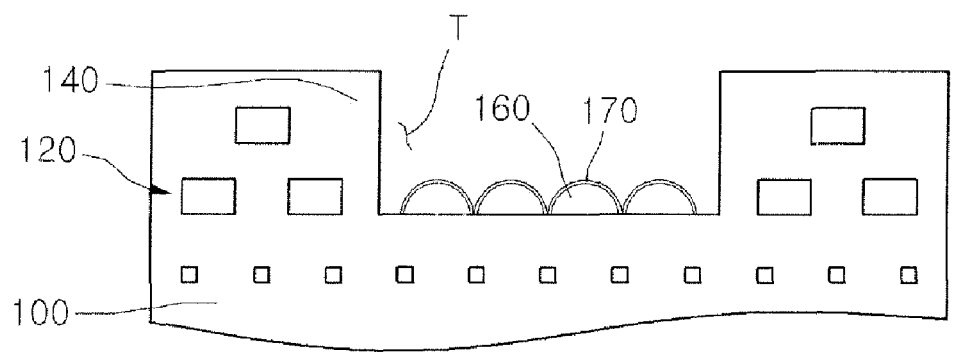
FIG. 6 is a cross-sectional view showing the procedure for manufacturing an image sensor according to another embodiment.

FIG. 6 is a cross-sectional view showing a procedure for manufacturing an image sensor according to another embodiment.

According to an embodiment, as shown in FIG. 6, after the second microlens pattern 160 is formed, a third microlens pattern 170 is formed on the second microlens pattern 160.

For example, after the remaining portion of the photoresist pattern 210 is removed, an insulating layer is deposited on the second microlens pattern 160 to form the third microlens pattern 170, so that a gapless microlens can be obtained.

The process to form the third microlens pattern 170 can be performed at a high temperature, for example, 350~400° C.

The disclosure is not limited to the embodiments and the drawings, and various modifications can be devised within the scope of the appended claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an image sensor, the method comprising:
   preparing a substrate including a pixel area and a logic circuit area;
   forming an interlayer dielectric layer on the substrate;
   forming a first microlens pattern on the interlayer dielectric layer on the pixel area;
   after the first microlens pattern is formed, forming a photoresist pattern on the interlayer dielectric layer, the photoresist pattern exposing the first microlens pattern; and
   forming a second microlens pattern by etching the interlayer dielectric layer on the pixel area using the first microlens pattern as an etch mask.

2. The method according to claim 1, wherein the top of the second microlens pattern is formed below the top surface of the interlayer dielectric layer.

3. The method according to claim 1, wherein the second microlens pattern is formed by etching the interlayer dielectric layer on the pixel area using the first microlens pattern and the photoresist pattern as an etch mask, whereby the second microlens pattern is formed in a trench in the interlayer dielectric layer.

4. The method according to claim 1, wherein the first microlens pattern is formed using a photoresist layer.

5. The method according to claim 1, wherein the second microlens pattern is formed through transfer of the first microlens pattern.

6. The method according to claim 1, further comprising, after the second microlens pattern is formed, forming a third microlens pattern on the second microlens pattern.

7. The method according to claim 6, wherein the third microlens pattern is formed using an insulating layer.

* * * * *